United States Patent
Westerman et al.

(10) Patent No.: US 6,544,696 B2
(45) Date of Patent: Apr. 8, 2003

(54) EMBEDDED ATTENUATED PHASE SHIFT MASK AND METHOD OF MAKING EMBEDDED ATTENUATED PHASE SHIFT MASK

(75) Inventors: Russell Westerman, Largo, FL (US); Christopher Constantine, Safety Harbor, FL (US)

(73) Assignee: Unaxis USA Inc., St. Petersburg, FL (US)

( * ) Notice: Subject to any disclaimer, the term of this patent is extended or adjusted under 35 U.S.C. 154(b) by 0 days.

(21) Appl. No.: 09/996,748

(22) Filed: Nov. 30, 2001

(65) Prior Publication Data
US 2002/0068229 A1 Jun. 6, 2002

Related U.S. Application Data
(60) Provisional application No. 60/250,351, filed on Dec. 1, 2000.

(51) Int. Cl.[7] .................................................. G03F 9/00
(52) U.S. Cl. ......................................................... 430/5
(58) Field of Search ........................... 430/5, 322, 323, 430/324, 311, 312

(56) References Cited

U.S. PATENT DOCUMENTS

| 5,382,483 | A |   | 1/1995  | Young              |       |
|-----------|---|---|---------|--------------------|-------|
| 5,405,721 | A |   | 4/1995  | Pierrat            |       |
| 5,576,123 | A | * | 11/1996 | Mohri et al.       | 430/5 |
| 5,876,877 | A | * | 3/1999  | Hanyu et al.       | 430/5 |
| 6,051,345 | A | * | 4/2000  | Huang              | 430/5 |
| 6,051,346 | A | * | 4/2000  | Kornblit et al.    | 430/5 |
| 6,319,639 | B1|   | 11/2001 | Reinberg           |       |
| 6,428,938 | B1| * | 8/2002  | Lin et al.         | 430/5 |

OTHER PUBLICATIONS

Garcia et al., "Thin Films for Phase–Shift Masks", Vacuum and Thinfilm Magazine, Sep. 1999, pp. 14–21.

Onodera et al., "ZrSiO, a new and robust material for attenuated phase–shift masks in ArF lithography", 19th Symposium of Photomask Technology, Sep. 1999, pp. 337–340.

* cited by examiner

Primary Examiner—S. Rosasco
(74) Attorney, Agent, or Firm—Foley & Lardner

(57) ABSTRACT

An embedded attenuated phase shift mask ("EAPSM") includes an etch stop layer that can be plasma etched in a process that is highly selective to the underlying quartz substrate. Selectivity to the underlying quartz maintains a desired 180 degree phase shift uniformly across the active mask area. Conventional plasma etching techniques can be utilized without damage to the underlying quartz substrate. Alternatively, the etch stop layer comprises a transparent material that can remain intact in the mask structure.

27 Claims, 5 Drawing Sheets

EMBEDDED ATTENUATED PHASE SHIFT MASK AND METHOD OF MAKING EMBEDDED ATTENUATED PHASE SHIFT MASK

RELATED APPLICATIONS

This application claims benefit of and priority to Provisional Application Ser. No. 60/250,351, filed on Dec. 1, 2000, entitled "EMBEDDED ATTENUATED PHASE SHIFT MASK AND METHOD OF MAKING EMBEDDED ATTENUATED PHASE SHIFT MASK," incorporated by reference in its entirety herein.

BACKGROUND OF THE INVENTION

1. Field of the Invention

The present invention is directed to a phase shift mask structure and a method for forming patterns on a semiconductor wafer.

2. Related Art

Conventional processes for the fabrication of semiconductor wafers often incorporate a lithographic process to create a desired pattern on a semiconductor wafer. For example, optical lithography can be used to transfer an integrated circuit pattern through a mask onto a semiconductor wafer, such as a silicon wafer. Conventional masks include chromium binary masks. Openings in the mask permit light from an optical projection unit or light source, such as a laser, to irradiate a photosensitive polymer (such as a conventional photoresist) layer on the surface of the silicon wafer. For example, conventional light sources for optical lithography include ultraviolet wavelength lasers, such as Krypton Fluoride (248 nanometers), Argon Fluoride (193 nanometers), and Fluoride ($F_2$; 157 nanometers) lasers.

One important consideration in the lithographic process is the level of contrast provided on the silicon wafer, where an increased contrast leads to higher resolution. The resolution on the surface of the silicon wafer, in turn, is a function of the wavelength of the imaging light and the numerical aperture of the projection lens utilized to focus the light onto the silicon wafer. Another factor in increased resolution is the depth-of-focus, which corresponds to the lithographic system's tolerance towards imperfection in wafer flatness. As a result of these relationships, current trends are moving towards increased numerical aperture lenses and imaging light having shorter wavelengths. Another approach is utilizing a phase-shift mask ("PSM") or "phase-shifting photomask" which results in higher contrast on the surface of the silicon wafer.

PSMs are becoming increasingly prevalent in the effort to extend the useful life of optical lithography. The PSM allows for increased pattern resolution in comparison to chromium binary masks. The increased resolution is achieved by shifting the phase of the light at feature boundaries 180 degrees relative to one another. This phase shift causes destructive interference at the feature boundary sharpening the feature image. See e.g., Garcia, et. al, "Thin Films for Phase-shift Masks", *Vacuum and Thinfilm Magazine,* September 1999, pg 14–21.

Currently there are two major approaches to constructing a phase shift mask: (1) alternating-aperture type (or "Levenson") masks and (2) Embedded Attenuated Phase-shift masks ("EAPSMs").

A conventional alternating-aperture type PSM consists of a quartz substrate that has been etched in various portions that correspond to the pattern to be imaged on the wafer.

Alternatively, EAPSMs can also be utilized. The EAPSM allows exposing light or ultra violet (UV) radiation to pass through all areas that are to be exposed on the wafer while simultaneously allowing a small fraction of light or UV radiation through in the nonexposed areas. In the areas that are to remain unexposed on the wafer, the light is shifted 180 degrees out of phase, and attenuated in intensity (to approximately 5% to 15% of the incoming intensity). This approach allows all features to be exposed or printed (by the unshifted light) with sharper edges due to destructive interference with the attenuated phase shifted light.

A common strategy for fabricating EAPSMs is to use either a single layer or multi-layer stack of phase shifting materials to shift and attenuate the light. For example, a conventional EAPSM has a structure similar to that shown in FIG. 1. EAPSM 10 has a transparent quartz substrate 12 and a shifter material layer 14.

Conventional phase shifter materials utilized for phase shifter layer 14 include $MoSi_xO_yN_z$, $Si_xN_y$, or $CrO_xF_y$. These materials are often utilized because the main chemical constituent, either silica, silicon nitride or chrome fluoride, is sufficiently transmissive (5%–20%) at the operating lithographic wavelength. Recent design trends have also opted toward multi-layer films where an optically transparent film is layered with an optically absorbing film. Some of the published multi-layer phase shifting films include SiN/TiN, MoSiON, CROF composites and, more recently, ZrSiO composites. See e.g., Onodera, et. al, "ZrSiO: a new and robust material for attenuated phase-shift mask in Ar—F lithography", $19^{th}$ *Annual Symposium of Photomask Technology,* September 1999, pg. 337–340.

Conventional processing of an EAPSM, such as EAPSM 10, which occurs as follows. A mask/resist is formed on phase shifter layer 14. A masking layer is patterned by lithography. Then, portions of phase shifter layer 14 are removed by a separate etching process using the masking layer as a mask. One conventional technique is to etch the shifter layer utilizing a Halogen-based, fluorine-based radio frequency ("RF") plasma etching.

SUMMARY OF THE INVENTION

The inventors have realized that the Halogen-based, fluorine-based RF plasma etching can also damage and/or remove a portion of the underlying quartz substrate, because such etching has low selectivity between the phase shifting layer and the substrate. This can adversely affect the phase-shift properties of the EAPSM.

In view of the foregoing, it would be desirable to provide an improved EAPSM structure that provides near optimal 180 degree phase shifting and a process for fabricating the EAPSM structure that does not damage the substrate layer of the EAPSM. According to one embodiment of the present invention a phase shift mask, capable of shifting a phase of incident light and/or ultra violet radiation 180 degrees, comprises a transparent substrate, an etch stop layer disposed on the substrate, and a layer comprising a phase shifting material disposed on the etch stop layer. The etch stop layer can comprise a material having a different etch chemistry from the substrate and from the phase shifting material.

According to another embodiment of the present invention, a process for fabricating a phase shift mask structure comprises providing a transparent substrate containing an etch stop layer over the substrate, a phase shifting layer comprising a phase shifting material over the etch stop layer, and a masking layer over the phase shifting layer. The process also comprises etching the phase shifting layer using the masking layer as a mask such that the etching stops on the etch stop layer. Further, in this embodiment, the etch stop layer can be engineered so that it can be etched with a plasma etch that includes plasma chemistries that are highly selective to the substrate.

According to another embodiment of the present invention, an in-process phase shift mask structure, capable of shifting the phase of incident light and/or ultraviolet radiation 180 degrees, comprises a transparent substrate, an etch stop layer disposed on the substrate, a layer comprising a phase shifting material disposed on the etch stop layer, a hard mask layer disposed on the phase shift material layer, and a resist layer disposed on the hard mask layer.

Further features and advantages of the invention, as well as the structure and operation of various embodiments of the invention, are described in detail below with reference to the accompanying drawings.

BRIEF DESCRIPTION OF THE DRAWINGS

The accompanying drawings, which are incorporated herein and form part of the specification, illustrate, but do not limit, the present invention and, together with the description, further serve to explain the principles of the invention and to enable a person skilled in the pertinent art to make and use the invention.

DETAILED DESCRIPTION

The inventors have discovered that providing an etch stop layer which has high etch selectivity with respect to a phase shifter layer can avoid damage to the substrate.

Figure 1:
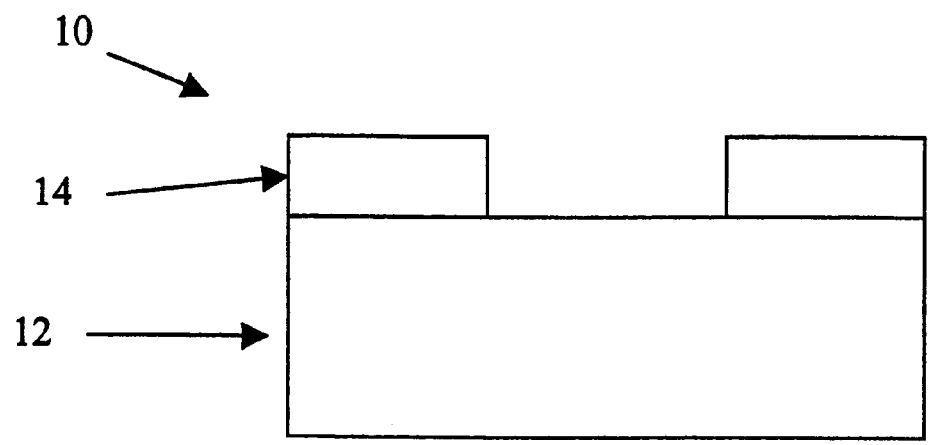
FIG. 1 is a schematic diagram of a conventional embedded attenuated phase shift mask (EAPSM) structure.
Figure 2:
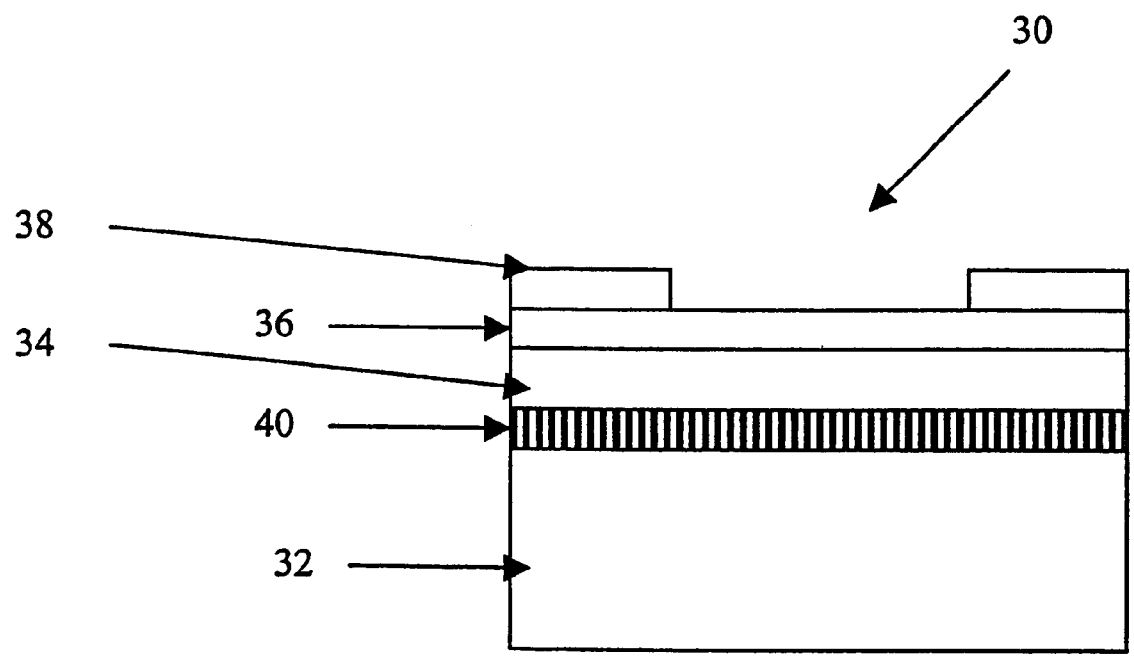
FIG. 2 is a schematic diagram of an in-process embedded attenuated phase shift mask structure according to an embodiment of the present invention.

FIG. 2 illustrates one preferred embodiment of the present invention, an in-process EAPSM structure 30, which includes a transparent substrate 32, a phase shifter material layer 34, a hard mask layer 36, a resist layer 38, and an etch stop layer 40 interposed between the substrate 32 and the phase shifter layer 34.

In this embodiment, the substrate 32 comprises a material having substantial transmission properties at the operating lithographic wavelength. For example, substrate 32 can comprise any of the following materials: quartz, calcium fluoride ($CaF_2$), or other conventional substantially transparent substrate materials. In a preferred embodiment, the substrate 32 is quartz. Substrate 32 preferably has a thickness of from about 2 millimeters (mm) to about 9 mm.

The phase shifter layer 34 can comprise any of a number of phase shifting materials, such as $MoSi_xO_yN_z$, MoSiN, $Si_xN_y$, and $CrO_xF_y$. In addition, the preferred EAPSM in-process structure 30 of the present invention can also include SiN/TiN, MoSiON, MoSiN, MoSiN/MoSiON, CrOF, $HfO_x$, $RuO_x$, $NiSi_x$, $TaSi_x$ and/or ZrSiO composite phase shifter layers. In a preferred embodiment, the phase shifter layer 34 is MoSiON or MoSiN, which have been used to provide a 180 degree phase shift in conventional EAPSMs. Shifter layer 34 can have a thickness from about 50 nanometers (nm) to about 200 nm. As would be apparent to one of ordinary skill in the art given the present description, various shifter material layer thicknesses can be used, depending on the material selected and the phase shift properties desired. For example, the following parameters are considered in selecting the shifter material:

(1) Radiation hardness—the material should not as likely be damaged (i.e., changed in composition or optical properties) from repeated exposures;

(2) Spatial uniformity—it is desirable that the shifter material can be deposited to a uniform, controllable depth;

(3) Optical properties—the material selected should shift the phase of the incoming light 180 degrees while cutting the incoming intensity by about 80% to about 95% and be of uniform composition so that optical "color centers" within the material are avoided; and (4) Process properties—the material selected should be capable of being etched anisotropically (typically by plasma) without defects.

According to this embodiment of the present invention, an etch stop layer 40 is disposed between the phase shifter layer (also referred to as the phase shifting material layer) 34 and the substrate 32 of in-process EAPSM structure 30. The etch stop layer 40 is any material that can provide high etch selectivity with respect to the phase shifter material during dry etching of the phase shifter layer 34 without adversely affecting the underlying substrate. Etch stop layer 40 preferably comprises a material that is resistant to phase shifter material etch chemistries, thus providing a protection from etching for the underlying substrate 32. In one embodiment, etch stop layer 40 comprises a metal-containing material that has a small thickness, sufficient for passing a substantial portion (e.g., about 80% to about 95% or more) of the incident light and/or UV radiation.

For example, etch stop layer 40 can comprise a metal-containing material such as Cr or $CrO_x$. Preferably, etch stop layer 40 comprises a CrO material having a thickness of from about 25 Angstroms (Å) to about 300 Å, or from about 25 Å to about 100 Å, or from about 25 Å to about 50 Å, or from about 50 Å to about 100 Å.

In another embodiment of the present invention, the etch stop layer 40 can comprise a substantially transparent material, such as $Al_2O_3$ (i.e., transparent polycrystalline alumina or single crystal (sapphire)). In addition, the transparent etch stop layer can have a reduced thickness of about 50 Å to about 200 Å, from about 50 Å to about 100 Å, or from about 50 Å to about 75 Å. The alternative etch stop layer material has optical properties such as index matching with the substrate, about 80% to about 95% (or higher) of incident light/UV radiation is transmitted at the desired wavelength, and defects or color center formation is reduced.

In-process EAPSM structure 30 optionally includes a hard mask or etch mask layer 36 which is used to define the etching of the underlying phase shifter layer 34. Etch mask layer 36 can comprise any of a number of conventional hard mask layer materials such as Cr, CrO, and the like. Etch mask layer 36 can have a thickness of about 30 nm to about 100 nm.

Alternatively, etch mask layer 36 is not a hard mask material. For example, etch mask layer 36 can comprise a polymer material having a thickness of about 100 nm to about 2000 mn.

In a further alternative embodiment, EAPSM 30 does not have to include a hard mask layer. For example, a resist layer 38 can be used to define the etching boundaries of shifter layer 34.

In-process EAPSM structure 30 further includes a resist layer 38, which can comprise a conventional polymer or photoresist material. Preferably, resist layer 38 comprises a thin layer of conventional photoresist (also referred to as an image layer) for initial pattern definition.

Variants of the aforementioned in-process EAPSM structure are also contemplated by the present invention. For example, the thicknesses of the etch stop layer and the shifter layer can be designed such that both shifter layer 34 and etch stop layer 40 contribute to the overall phase-shifting properties of the resulting EAPSM. Alternatively, the Cr or $CrO_2$ etch stop layer may be removed after shifter patterning with high selectivity to quartz using conventional techniques, as will be apparent to one of ordinary skill in the art given the present description.

An advantage of the structure of in-process EAPSM 30 is that it can be adapted to conventional fabrication techniques, without the resulting damage to the substrate layer. Further, because the substrate 32 (e.g., quartz) is protected from the etchant materials used to etch the phase shifter layer 34, the present invention provides a straightforward EAPSM fabrication process that yields an EAPSM with acceptable optical properties that can be manufactured in mass quantities.

Figure 3:
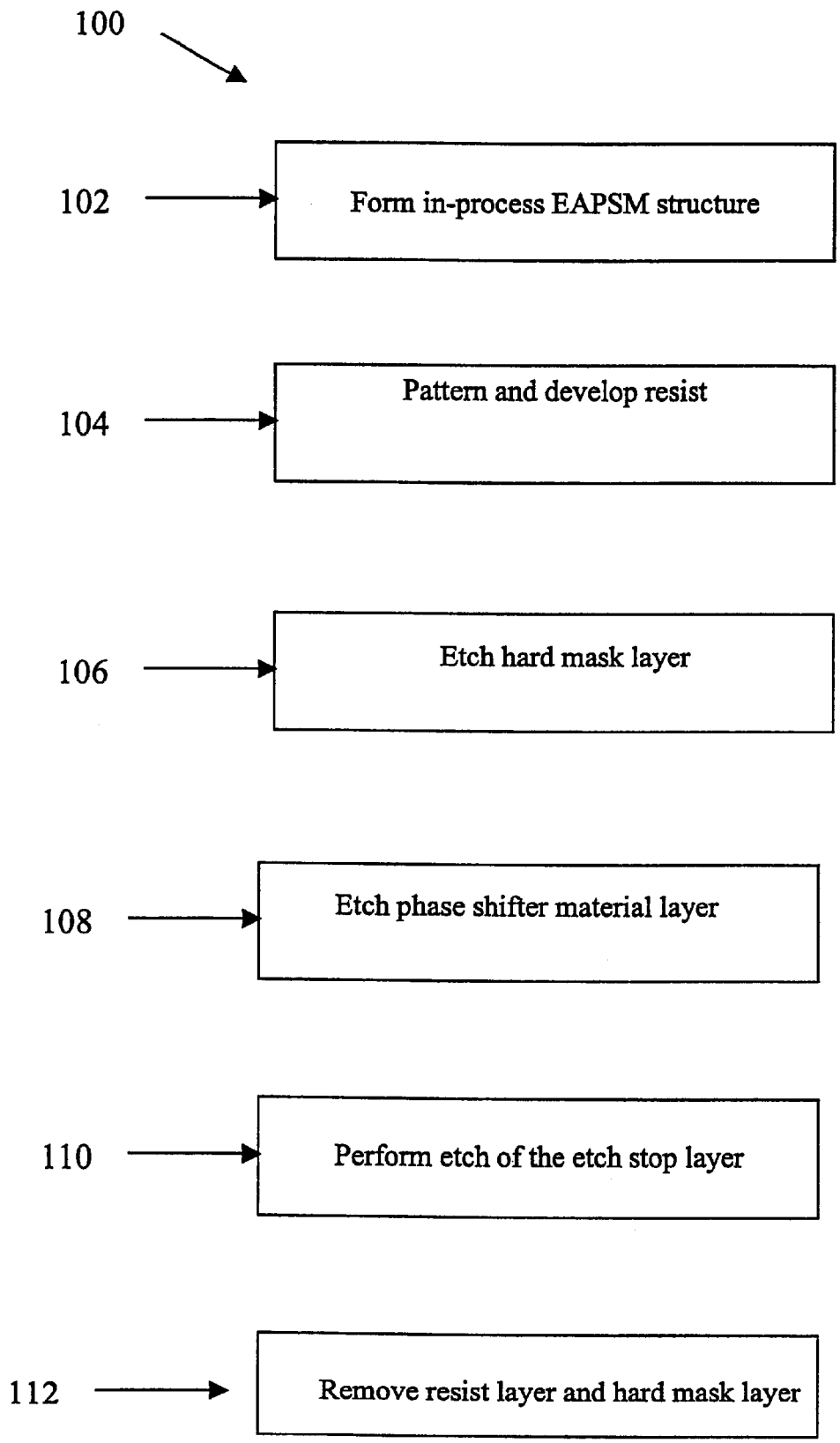
FIG. 3 is a flow chart of a process for fabricating a EAPSM according to an embodiment of the present invention.

According to another embodiment of the present invention, a process 100 for fabricating an EAPSM is shown in flow chart form in FIG. 3. In step 102, the in-process EAPSM structure 30 is formed as shown in FIG. 2. The in-process EAPSM structure comprises, for example, a substrate 32, a phase shifter layer 34, an etch stop layer 40 disposed between the substrate and the phase shifter layer, a hard mask layer 36 deposited on the phase shifter layer, and a resist layer 38 formed on the hard mask layer 36. The thickness of each layer can be selected based on the desired optical properties of the resulting EAPSM. These layers can be formed according to conventional deposition techniques, as will be apparent to one of skill in the art given the present description.

In step 104, the resist layer 38 is patterned and developed, as shown in FIG. 2. For example, conventional ultraviolet exposure, electron beam or I-line lithography and a regular wet development can be used for the photoresist layer 38 patterning.

Figure 5A:
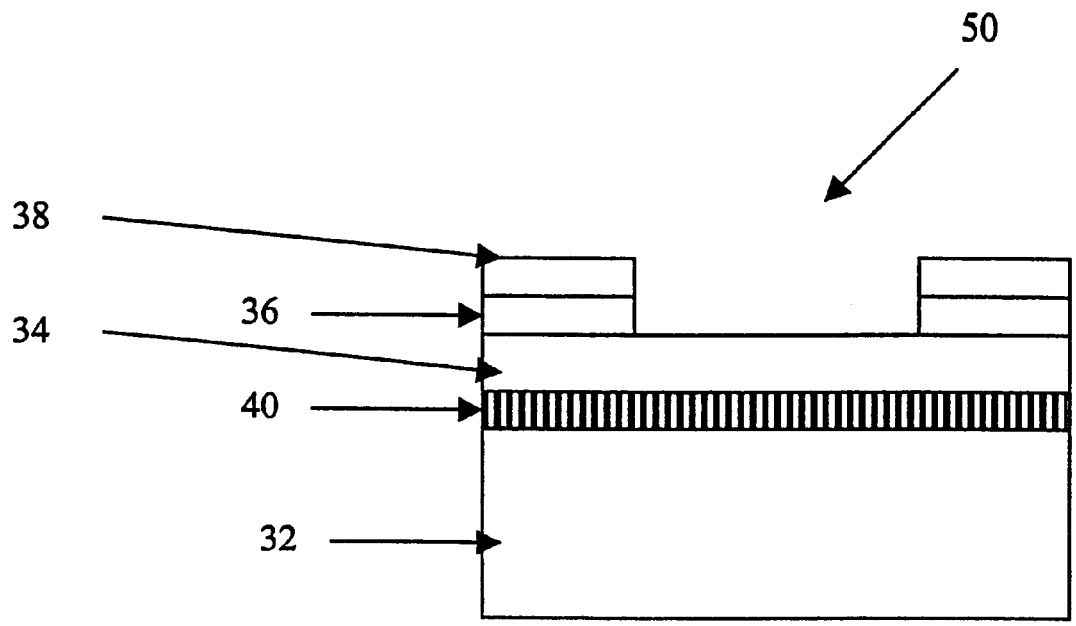
FIG. 5A is a schematic diagram of a second in-process EAPSM structure according to an embodiment of the present invention.

In step 106, the hard mask layer 36 is etched using resist layer 38 as a mask, resulting in a second in-process EAPSM structure 50 as shown in FIG. 5A. For example, a wet etch or plasma etch can be utilized. The plasma etch can be an inductively coupled plasma etching ("ICP") technique. Alternatively, a reactive ion etching ("RIE") process can be used to perform the etch of the hard mask layer 36. An ICP process differs from an RIE process in that the mechanical and chemical portions of the ICP process can be separately controlled. In a preferred embodiment, a chlorine-based $(Cl_2/O_2)$ plasma etching technique can be utilized. After step 106, the resist layer 38 can be removed by conventional techniques, such as ashing.

Figure 5B:
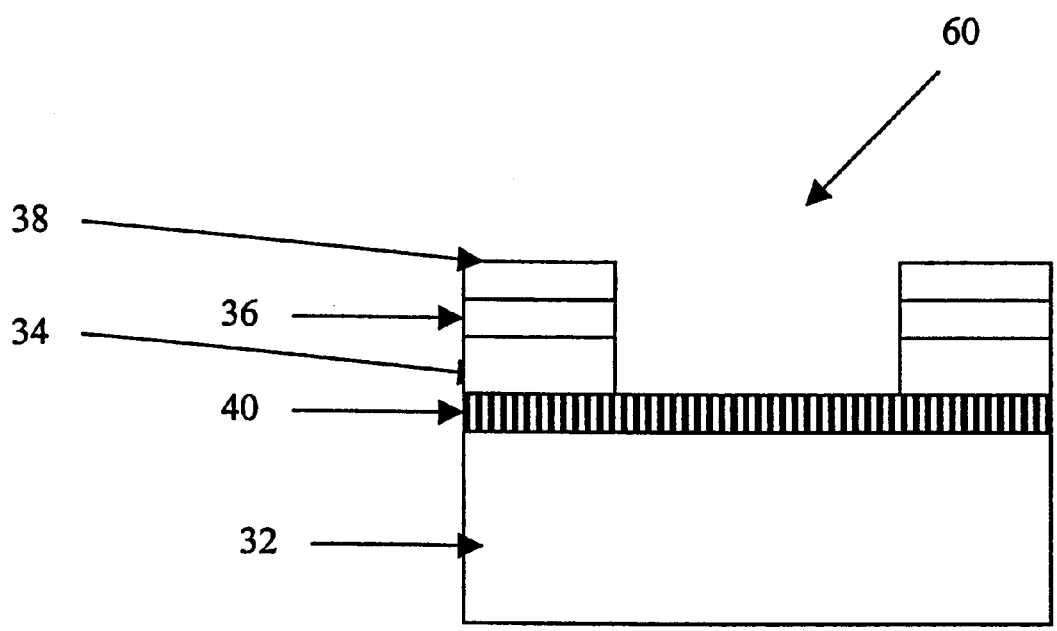
FIG. 5B is a schematic diagram of a third in-process EAPSM structure according to an embodiment of the present invention.

In step 108, the underlying phase shifter layer 34 (e.g., MoSiON, MoSiN, SiN, TiN, ZrSiO, $HfO_x$, $RuO_x$, $NiSi_x$, $ZrO_x$, $ZrSiO_x$, $TaSi_x$ or the like) is etched in a wet etch or plasma etch process, using the hard mask layer 36 (or the resist layer 38 and hard mask layer 36) as a mask, resulting in a third in-process EAPSM structure 60 as shown in FIG. 5B.

Alternatively, one can use a high density plasma (ICP) and/or a RIE technique with biasing the cathode. ICP controls the plasma density (i.e., number of ions available) while RIE controls ion energy at the substrate. For example, a Halogen-based plasma, i.e. $F_2$, $Cl_2$, $Br_2$, $I_2$, can be utilized to etch the phase shifter layer 34. According to a preferred embodiment of the present invention, incorporation of an etch stop 40 in the EAPSM structure helps both high density ICP and capacitive RIE etching. Preferably, a fluorine based plasma is utilized, with a desired etch selectivity ratio of phase shifter:etch stop>10:1, or, alternatively, a selectivity ratio of phase shifter:etch stop>5:1, or, alternatively, a selectivity ratio of phase shifter:etch stop>3:1. Without the addition of the etch stop layer 40, the fluorine-based plasma, upon reaching the phase shifter/substrate interface, will continue to etch the quartz substrate, thus changing the overall phase shift properties of the EAPSM, because fluorine-based plasma has low selectivity between phase shifter layer 34 and substrate 32. As will be apparent to one of skill in the art given the present description, resist layer 38 can be removed before or after step 108.

Figure 5C:
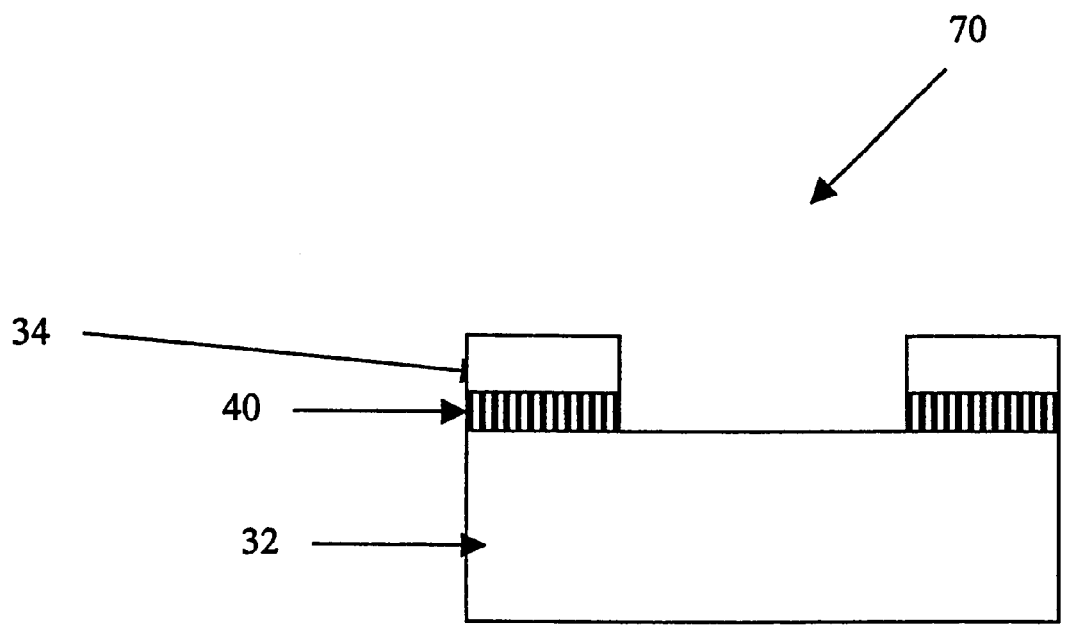
FIG. 5C is a schematic diagram of a EAPSM according to an embodiment of the present invention.

Optionally, in step 110, the etch stop layer 40 can be etched in a plasma process selective to the substrate 32, resulting in EAPSM structure 70 shown in FIG. 5C. In a preferred embodiment, a chlorine-based plasma etch is utilized. For example, when using Cr or $CrO_x$ as the etch stop layer and quartz as the substrate, the estimated etch selectivity in chlorine-based plasma results in a selectivity ratio of Cr:Quartz being between 5:1 to more than 100:1, e.g., about 40:1.

Figure 5D:
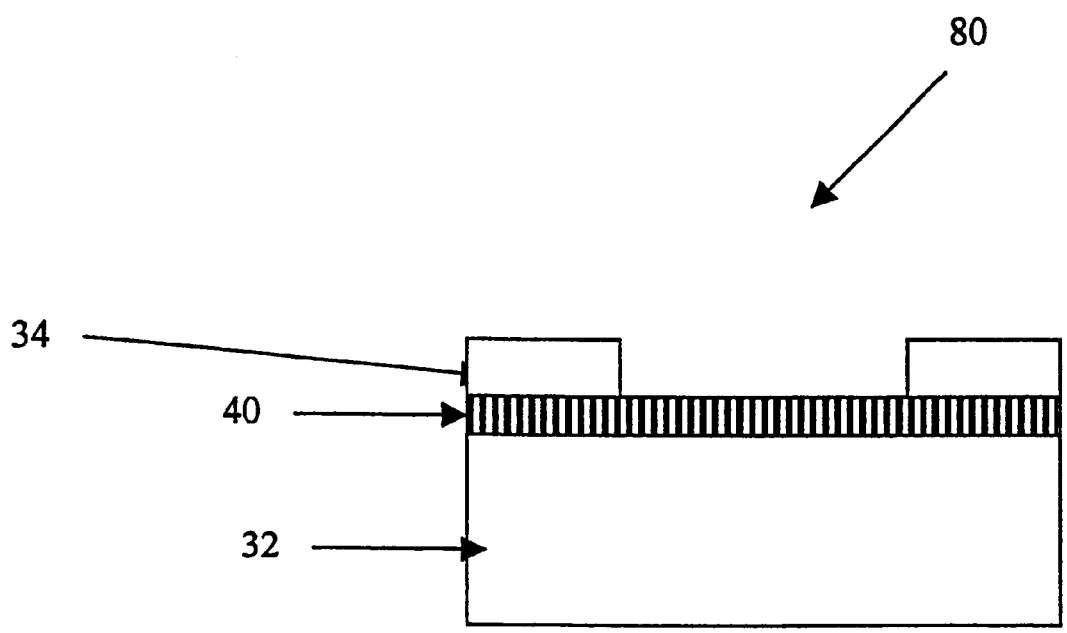
FIG. 5D is a schematic diagram of a EAPSM according to an alternative embodiment of the present invention.

Alternatively, if the etch stop layer 40 is of a minimal thickness capable of sustaining an acceptable transmission of the light source during wafer patterning, step 110 can be omitted. For example, a Cr layer having a thickness of about 100 Å transmit about 80% of 248 nm light. An EAPSM structure 80 having a non-etched etch stop layer 40 is shown in FIG. 5D.

According to another alternative embodiment, an $Al_2O_3$ etch stop layer 40 has substantial transmission properties at the desired wavelength. As discussed above, the etch stop layer 40 can be fabricated from a transparent material (such as $Al_2O_3$) which has desirable transmission properties, index matching properties, lack of color center formation, radiation hardness, and phase shift ability. Further, the etch stop has dry etch selectivity to the phase shifter layer patterning dry etch process.

Alternatively, an $Al_2O_3$ etch stop layer 40 can be left in place after the phase shifter patterning dry etch process, thus making fabrication more straightforward.

In step 112, the resist layer 38 and the hard mask layer 36 are removed. The removal of these layers can be performed at several different times during the EAPSM fabrication process, as will be apparent to one of skill in the art given the present description. The removal of layers 38 and 36 can be performed using conventional techniques.

The resulting EAPSM structures 70 and 80 according to alternative embodiments are shown in FIGS. 5C and 5D, respectively. In FIG. 5C, the etch stop layer 40 is etched. In FIG. 5D, the etch stop layer 40 is not etched.

According to preferred embodiments of the present invention, the high etch selectivity of the phase shifter layer compared to the etch stop layer will allow the use of a more physical plasma etch process. For example, an ion driven process, such as utilizing a high fluorocarbon plasma RIE component during an ICP etch, provides for a tighter critical dimension ("CD") control within the shifter without the loss of phase control due to an overetch into the quartz substrate.

In addition, the etch stop can also act as part of the phase shifter material and as an attenuator. The final pattern in the etch stop layer can be defined with a high selectivity (>10:1) to a quartz substrate allowing good CD performance without sacrificing phase control.

Figure 4:
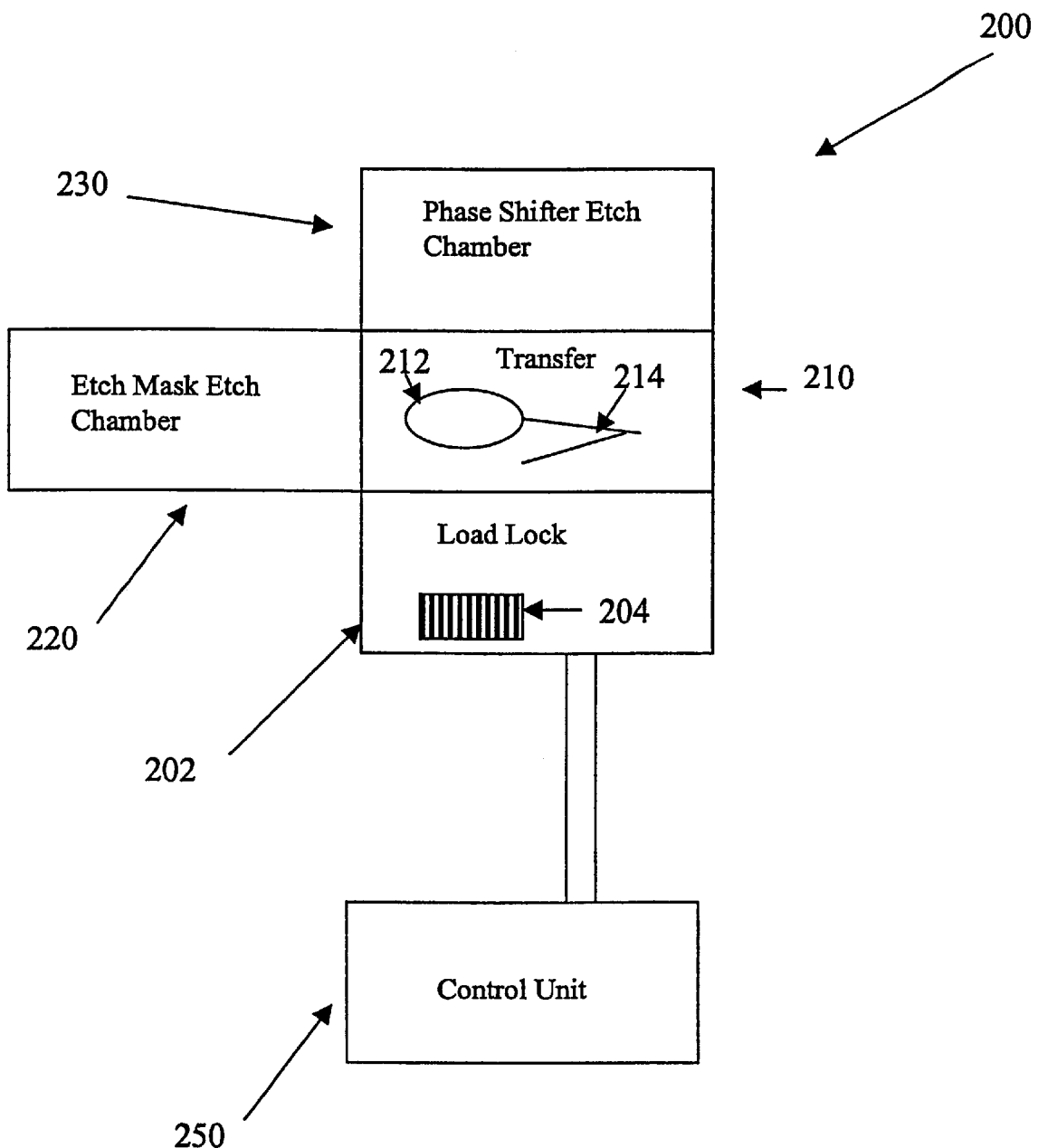
FIG. 4 is a schematic diagram of a device of the present invention to fabricate an embedded attenuated phase shift mask.

Because one or more of the layers of the EAPSM can be highly selective to the underlying quartz substrate, an automated EAPSM fabrication process can be utilized. According to another embodiment of the present invention, a fabrication device can be utilized to perform the mask etch, phase shifter etch, and (optionally) a process to further etch the etch stop layer to fabricate an EAPSM. As shown in FIG. 4, an exemplary processing unit 200 is shown having a load lock module 202, a transfer module 210, a mask etch chamber 220, a shifter etch chamber 230, and a control unit 250. For example, the process steps can be performed in a modified commercial unit, such as a Versalock® 700 model processing platform (available from Unaxis, Inc.), a semi-automated handling system and general purpose tool for use in a wide variety of semiconductor fabrication applications.

In one mode of operation, EAPSM structures 30 are stored in a cassette 204 in load lock module 202. A robotic handling system 214 in transfer module 210 takes EAPSM structures 30 out of a container 212. The robotic system then loads the EAPSM structures into the appropriate processing chamber. In this example, the EAPSM structures are pre-formed multi-layer structures, such as structure 30 in FIG. 2. A first vacuum chamber, such as hard mask etch chamber 220, can be used to perform a mask etch of a hard mask etch layer, such as a chromium layer 36. The mask etch can be performed by a Reactive Ion Etching ("RIE") technique or an Inductively Coupled Plasma etching ("ICP") technique. In a preferred embodiment, chamber 220 is a chlorine plasma chamber.

After the mask etch process, the robotic system then loads the EAPSM structures into a phase shifter etch chamber 230. This vacuum chamber can utilize an ICP or RIE technique to etch the shifter layer of the EAPSM structure. The etch time can be preset or controlled through control unit 250, which includes a graphical user interface to allow an operator to control all aspects of the processing. In a preferred embodiment, chamber 230 is a fluorine plasma chamber.

Optionally, after the phase shifter etch process, the robotic system can then load the EAPSM structures back into a mask etch chamber 220. This vacuum chamber can utilize an ICP or RIE technique to etch the etch stop layer 40 of the EAPSM structure. For example, in one embodiment, both the hard mask etch and etch stop layer definition are performed using a chlorine-based etching technique. Alternatively, the mask etch, the shifter etch, and the etch stop layer definition could be performed in a single chamber, with a possible additional cleaning process between the etch steps.

In a further embodiment of the present invention, the EAPSM is used to fabricate a semiconductor device or integrated circuit. For example, a resist formed on a semiconductor wafer is exposed to light or UV radiation passed through the EAPSM, such as EAPSM structure 70 or EAPSM structure 80, for patterning. The semiconductor device or integrated circuit is then completed using conventional fabrication techniques, as will be apparent to one of ordinary skill in the art given the present description.

Thus, the present invention is directed to a phase shift mask structure for an embedded attenuated phase shift mask (EAPSM), a method for fabricating an EAPSM, and a method for fabricating a semiconductor device.

As the inventors have determined, while the conventional phase shifting material candidates discussed above have desirable optical properties, however, none of the films, with the exception of CrOF, can be plasma etched in a process that is highly selective to the underlying quartz substrate. Selectivity to the underlying quartz is important in maintaining the desired 180 degree phase shift uniformly across the active mask area. In other words, due to the current designs of EAPSMs, it is difficult to fabricate EAPSMs having optimal phase shift properties because the conventional methods of fabricating EAPSMs lead to damage of the underlying quartz substrate.

According to the present invention, plasma etch selectivity to the quartz substrate can be greatly improved by adding an etch stop layer at the phase shifter/substrate interface of the EAPSM. Because conventional chemistries used to etch the shifter material of the EAPSM are not selective to a substrate such as quartz, conventional EAPSM fabrication processes cause damage to the quartz substrate and resulting in unacceptable yield losses. The etch stop layer of one embodiment of the present invention etches reactively in plasma chemistries that are highly selective to the quartz substrate, thus protecting the quartz substrate. The etch stop layer in another embodiment is highly transparent (to light and/or UV radiation) and has optical properties similar to the substrate so that it is not necessary to remove the etch stop layer after patterning the phase shift layer. The etch stop layer also has a thickness that allows for complete or partial transmission of normally incident light, thus yielding an EAPSM with acceptable optical properties that is more straightforward to manufacture in mass quantities.

While the invention has been described in detail and with reference to specific embodiments thereof, it will be apparent to one skilled in the art that various changes and modifications can be made therein without departing from the scope of the invention. Thus, the breadth and scope of the present invention should not be limited by any of the above-described exemplary embodiments.

What is claimed is:

1. A phase shift mask, capable of shifting a phase of incident light and/or ultra violet radiation 180 degrees, comprising:
    a transparent substrate;
    a non-opaque etch stop layer disposed on said substrate, said etch stop layer selected from the group consisting of Cr-containing films; and
    a layer comprising a phase shifting material disposed on said etch stop layer.

2. The phase shift mask according to claim 1, wherein the etch stop layer has a plasma etch selectivity with respect to the phase shifting layer of greater than 3 to 1.

3. The phase shift mask according to claim 1, wherein the etch stop layer Cr-containing film has a different etch chemistry from the substrate and from the phase shifting material.

4. The phase shift mask according to claim 1, wherein said substrate comprises quartz having a thickness of about 2 millimeters (mm) to about 9 mm.

5. The phase shift mask according to claim 1, wherein the etch stop layer is Cr having a thickness of about 25 Å to about 300 Å.

6. The phase shift mask according to claim 1, wherein the etch stop layer is CrO having a thickness of about 25 Å to about 300 Å.

7. The phase shift mask according to claim 1, wherein said phase shifting material layer is selected from the group consisting of $MoSi_xO_yN_z$, MoSiN, $Si_xN_y$, $CrO_xF_y$, SiN/TiN, CrOF, $HfO_x$, $RuO_x$, $ZrSi_x$, $ZrO_x$, $ZrSiO_x$, $NiSi_x$, $TaSi_x$ and ZrSiO.

8. The phase shift mask according to claim 7, wherein said phase shifting material layer is $MoSi_xO_yN_z$ having a thickness of about 50 nm to about 200 nm.

9. The phase shift mask according to claim 1, wherein the etch stop layer has a plasma etch selectivity with respect to the phase shifting layer of greater than 5 to 1.

10. The phase shift mask according to claim 1, wherein the etch stop layer has a plasma etch selectivity with respect to the phase shifting layer of greater than 10 to 1.

11. The phase shift mask according to claim 1, wherein the etch stop layer has a selectivity with respect to the substrate of between 5 to 1 and 100 to 1.

12. A method of fabricating a phase shift mask, comprising:
providing a transparent substrate including a non-opaque etch stop layer disposed on the substrate, a phase shifting layer comprising a phase shifting material disposed on the etch stop layer, and a masking layer disposed on the phase shifting layer, said etch stop layer selected from the group consisting of Cr-containing films; and
etching the phase shifting layer using the masking layer as a mask such that the etching stops on the etch stop layer.

13. The method according to claim 12, wherein said providing step includes
providing an etch stop having a different etch chemistry from the substrate and from the phase shifting material wherein the etch stop layer has a plasma etch selectivity with respect to the phase shifting layer of greater than 3 to 1.

14. The method according to claim 12, further comprising:
etching the etch stop layer.

15. The method according to claim 14, further comprising:
removing the masking layer.

16. The method according to claim 12, wherein the masking layer comprises a resist layer disposed on a hard mask layer, and further comprising:
performing a lithographic patterning and development of the resist layer; and etching the hard mask layer to form the masking layer.

17. The method according to claim 16, wherein said hard mask etch comprises etching the hard mask layer with a chlorine-based plasma.

18. The method according to claim 17, wherein said phase shifting material layer etching comprises etching the phase shifting material layer with a Halogen-based plasma.

19. The method according to claim 16, wherein said phase shifting material layer etching comprises etching the phase shifting material layer with a Halogen-based plasma.

20. The method according to claim 12, further comprising:
etching said etch stop layer with a plasma etch that includes plasma chemistries that are selective to the substrate.

21. The method according to claim 20, wherein said etch stop layer comprises a Cr containing layer having a thickness of about 25 Å to about 300 Å and the plasma etch comprises a fluorine-based plasma etch.

22. An in-process phase shift mask structure, capable of shifting the phase of incident light and/or ultraviolet radiation 180 degrees, comprising:
a transparent substrate;
a non-opaque etch stop layer disposed on said substrate, said etch stop layer selected from the group consisting of Cr-containing films;
a layer comprising a phase shifting material disposed on said etch stop layer;
a hard mask layer disposed on said phase shift material layer; and
a resist layer disposed on said hard mask layer.

23. The in-process phase shift mask according to claim 22, wherein the etch stop layer, the phase shifting layer, the hard mask layer, and the resist layer are patterned and have the same patterning.

24. The in-process phase shift mask according to claim 22, wherein said mask layer comprises Cr having a thickness of about 30 nm to about 100 nm.

25. The phase shift mask according to claim 22, wherein said mask layer is a polymer material having a thickness of about 100 nm to about 2000 nm.

26. An embedded attenuated phase shift mask, comprising:
a transparent substrate;
a patterned transmissive etch stop layer disposed on the substrate, said etch stop layer selected from the group consisting of Cr-containing films; and
a patterned phase shifting material layer disposed on the etch stop layer, wherein the etch stop layer is etch resistant with respect an etchant for etching the phase shifting material layer, and wherein the phase shifting material is partially transmissive to imaging radiation.

27. An in-process phase shift mask structure, capable of shifting the phase of incident light and/or ultraviolet radiation 180 degrees, comprising:
a transparent substrate;
a non-opaque etch stop layer disposed on said substrate, said etch stop layer selected from the group consisting of Cr-containing films;
a phase shifter layer comprising a phase shifting material disposed on said etch stop layer; and
a layer disposed on said phase shifter material layer to define the etching boundaries of the phase shifter material layer, said layer selected from the group consisting of polymers and resist materials.

* * * * *